United States Patent [19]

Tanaka

[11] Patent Number: 5,801,566
[45] Date of Patent: Sep. 1, 1998

[54] SYSTEM CLOCK GENERATING CIRCUIT FOR A SEMICONDUCTOR DEVICE

[75] Inventor: Nobuhiko Tanaka, Hyogo, Japan

[73] Assignees: Mitsubishi Electric Semiconductor Software Co., Ltd., Hyogo; Mitsubishi Denki Kabushiki Kaisha, Tokyo, both of Japan

[21] Appl. No.: 691,928

[22] Filed: Aug. 5, 1996

[30] Foreign Application Priority Data

Apr. 3, 1996 [JP] Japan .................. 8-081490

[51] Int. Cl.⁶ ............... H03L 7/06; H03L 7/08; H03K 5/06
[52] U.S. Cl. ............ 327/259; 327/244; 327/245; 327/251
[58] Field of Search ................ 327/233–235, 327/239, 243, 244, 245, 250, 251, 253, 256–259, 141, 146–150, 152, 153, 155–159, 161; 331/49, 57; 375/375, 376

[56] References Cited

U.S. PATENT DOCUMENTS

| | | | |
|---|---|---|---|
| 4,494,021 | 1/1985 | Bell et al. | 327/259 |
| 5,039,893 | 8/1991 | Tomisawa | 327/278 |
| 5,081,428 | 1/1992 | Atriss et al. | 331/57 |
| 5,146,121 | 9/1992 | Searles et al. | 327/244 |
| 5,428,309 | 6/1995 | Yamauchi et al. | 327/158 |
| 5,475,344 | 12/1995 | Maneatis et al. | 327/158 |
| 5,638,019 | 6/1997 | Frankeny | 327/272 |

FOREIGN PATENT DOCUMENTS 289422 3/1990 Japan .

Primary Examiner—Timothy P. Callahan
Assistant Examiner—T. T. Lam
Attorney, Agent, or Firm—Leydig, Voit & Mayer, Ltd.

[57] ABSTRACT

According to the present invention, when a semiconductor device is tested, a signal for test can be set in the semiconductor device at a desired timing. A second delay circuit of the present invention has the same structure as a first delay circuit in a phase lock loop, and receives a control voltage from the phase lock loop so as to generate a clock signal with a frequency according to the control voltage and to delay and output the clock signal. A second pulse generator generates two-phase clocks by using delayed signals generated by the second delay circuit. Switches are used for switching between a system clock output terminal during an actually active time and a system clock output terminal during testing.

8 Claims, 16 Drawing Sheets

FIG. 15A  $X_{in}$
FIG. 15B  P1
FIG. 15C  P2
FIG. 15D  SWITCHING OF OPERATION (PRIOR ART)

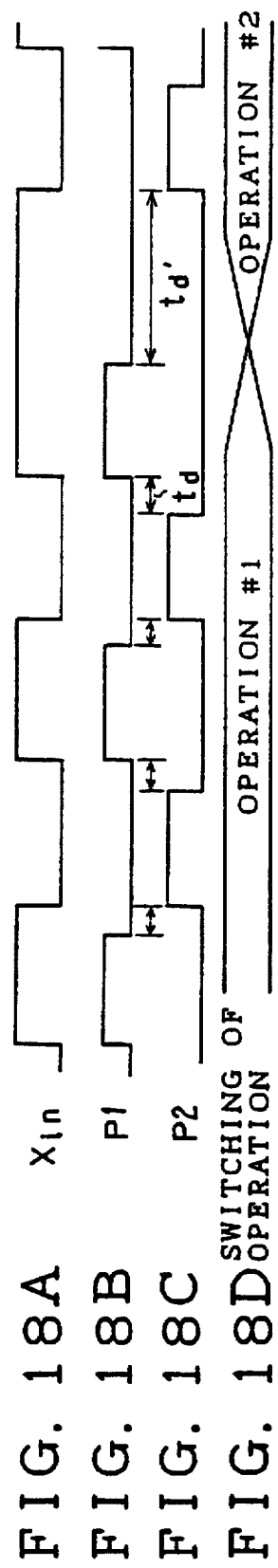

SYSTEM CLOCK GENERATING CIRCUIT FOR A SEMICONDUCTOR DEVICE

BACKGROUND OF THE INVENTION

1. Field of the Invention

The present invention relates to a system clock generating circuit for a semiconductor device, which is built into the semiconductor device to generate two-phase clocks with high periods kept from overlapping.

2. Description of the Prior Art

Typical system clocks used in a semiconductor device include two-phase clocks with their high periods kept from overlapping (hereinafter briefly referred to as two-clocks). The two-phase clocks can easily be generated by using a phase lock loop (hereinafter referred to as PLL) having the signal delay function.

FIG. 14 is a block diagram showing a conventional system clock generating circuit using the PLL, in a semiconductor device. In the drawing, reference numeral 400 denotes a PLL for outputting the two-phase clocks. In the PLL 400, reference numeral 1A denotes a delay circuit for delaying an input signal, 3A is a pulse generator for receiving signals from several delay stages among a plurality of delay stages in the delay circuit 1A, and for generating a one-phase clock P1 and the other-phase clock P2 depending upon the introduced signals, 5 is a phase comparator for comparing a phase of a clock signal input through a buffer 8 from a clock input terminal $X_{in}$ with a phase of the one-phase clock P1 from the pulse generator 3A, 6 is a charge pump outputting a voltage instruct signal according to a phase difference output from the phase comparator 5, and 7 is a low-pass filter for smoothing the voltage instruct signal from the charge pump 6 so as to feed a control voltage to the delay circuit 1A. The delay circuit 1A delays the input signal, and forms a voltage controlled oscillator (VCO).

A description will now be given of the operation.

The clock signal inputted from the clock input terminal $X_{in}$ is fed as a reference clock signal to one input terminal of the phase comparator 5 through the buffer 8. In the circuit shown in FIG. 14, the clock signal is fed to a clock output terminal $X_{out}$ as well as the one input terminal. The other input terminal of the phase comparator 5 takes as an input the one-phase clock P1 from the pulse generator 3A as a feedback clock signal. The phase comparator 5 detects a phase difference between the signals input to both the terminals, and the phase comparator 5 outputs signals showing the phase difference to the charge pump 6. The charge pump 6 outputs a signal according to the phase difference. For example, when the phase of the clock P1 lags behind the phase of the reference clock signal, the charge pump 6 outputs a signal to instruct a rise of voltage. Alternatively, when the phase of the clock P1 leads the phase of the reference clock signal, the charge pump 6 outputs a signal to instruct a fall of the voltage.

The voltage of a capacitor in the low-pass filter 7 varies in response to the signal from the charge pump 6. The voltage is supplied to the delay circuit 1A. In this case, the low-pass filter 7 can also serve to determine characteristics of the PLL 400 such as a speed of response. The delay circuit 1A causes a variation in frequency of an output signal according to the inputted control voltage. When the reference clock signal is in phase with the clock P1, no variation is caused in output from the charge pump 6, resulting in no variation in frequency of the output signal from the delay circuit 1A.

The delay circuit 1A includes a plurality of cascaded delay elements. The pulse generator 3A selects several outputs from among outputs from the delay elements so as to create the two-phase clocks P1, P2 having a desired phase difference (skew) $t_d$. In FIG. 14, three outputs are selected. The pulse generator 3A generates the two-phase clocks P1, P2 according to the selected output signals. As in the above method, it is possible to generate the two-phase clocks P1, P2, as shown in FIGS. 15A to 15C, identical with the clock signal input from the clock input terminal $X_{in}$ in frequency, and having the desired phase difference $t_d$.

In testing the semiconductor device, there is required processing in which a predetermined signal is externally fed to the semiconductor device at a certain time point so as to check an output signal depending upon the signal. For example, at a time of a transition from the operation #1 to the operation #2 in FIG. 15D, the predetermined signal for the test is fed. However, if the signal is unconditionally fed, there are problems in that a waveform of the signal has rounding due to capacitance of wiring or the like, and the signal for the test can not be set in the semiconductor device at a desired timing. FIG. 15D illustrates a case where as the predetermined signal for the test, a signal is input to instruct switching of the operation of the semiconductor device such as a microprocessor.

Hence, in order to feed the predetermined signal to the semiconductor device, there is a possible method in which the clock signal inputted from the clock input terminal $X_{in}$ is interrupted or a frequency of the clock signal is reduced, and input of the clock signal is resumed or the clock signal is restored to its original frequency after the completion of setting of the predetermined signal. However, according to the method, synchronization is once lost in the PLL 400. Thus, the semiconductor device can not normally be operated for a period from the resumption of input of the clock signal or the restoration of the frequency of the clock signal, to the next establishment of synchronization of the PLL 400. That is, it is impossible to readily and normally start the operation of the semiconductor device even when the predetermined signal for the test is set in the semiconductor device, resulting in virtual incapability of performing the test.

Therefore, in testing the semiconductor device, there is another possible method in which two-phase clocks P1 and P2 are generated by a flip-flop instead of the PLL 400, and the phase difference $t_d$ is given by a delay element. FIG. 16 is a block diagram showing a structure of a system clock generating circuit to realize the method. In the drawing, reference numeral 17 denotes a switch for feeding a clock signal input from a clock input terminal $X_{in}$ to any one of a PLL 400 and a second pulse generator 16, 11 is a switch to for selecting any one of a clock P1 by the PLL 400 and a clock P1 by the second pulse generator 16, and 13 is a switch to for selecting any one of a clock P2 generated by the PLL 400 and a clock P2 generated by the second pulse generator 16.

FIG. 17 is a circuit diagram showing one illustrative structure of the second pulse generator. As shown in FIG. 17, the second pulse generator 16 includes, for example, inverted OR circuits (NOR circuits) 151 and 152 forming a flip-flop, an inverting circuit (inverter) 150 arranged on the side of one input terminal of the NOR circuit 151, inverters 153 to 158 arranged on the side of the other input terminal of the NOR circuit 151 to form delay elements, and inverters 159 to 164 arranged on the side of one input terminal of the NOR circuit 152 to form delay elements.

During an actually active time of the semiconductor device, the switch 17 is set to input the clock signal inputted from the clock input terminal $X_{in}$ to the PLL 400, and the switches 11 and 13 are set to output the two-phase clocks P1 and P2 from the PLL 400 to each section of the semiconductor device. Thus, the semiconductor device can be operated according to a system clock generated by the PLL 400. "Actually active time" as used herein means an operation time when no test is made on the semiconductor device, that is, a time when the semiconductor device is built into a predetermined system and is operated to serve a function required in the system.

In testing the semiconductor device, the switch 17 is set to input the clock signal input from the clock input terminal $X_{in}$ to the second pulse generator 16, and the switches 11 and 13 are set to output the two-phase clocks P1 and P2 from the second pulse generator 16. Subsequently, as shown in FIGS. 18A to 18D, when the predetermined signal for the test is set in the semiconductor device, the frequency of the clock signal inputted from the clock input terminal $X_{in}$ is reduced. In this state, when the predetermined signal for the test is inputted to the semiconductor device, the signal can correctly be set in the semiconductor device. However, in the circuit structure, the skew between the two-phase clocks P1 and P2 may be $t_d'$ as shown in FIG. 18C, and can not be kept to the desired phase difference $t_d$. Therefore, the set signal may be abnormally propagated in the semiconductor device.

The conventional system clock generating circuit in the semiconductor device has the above structure. Hence, there is a problem in that the signal for the test can not be set in the semiconductor device at a desired timing when the semiconductor device is tested.

SUMMARY OF THE INVENTION

The present invention is made to overcome the above problem, and it is an object of the present invention to provide a system clock generating circuit in a semiconductor device, in which two-phase clocks P1, P2 with optional frequencies can be generated while a desired phase difference $t_d$ being kept between the two-phase clocks P1 and P2 even at a test time.

It is to be noted that the prior art similar to the present invention has been disclosed in JP-A-2/89422.

According to the first aspect of the present invention, for achieving the above-mentioned object, there is provided a system clock generating circuit in a semiconductor device including a second delay circuit, which has the same structure as that of a first delay circuit in a PLL, for introducing control voltage from the PLL, for generating a clock signal with a frequency according to the control voltage, and for delaying and outputting the clock signal, and a pulse generator for generating two-phase clocks by using delayed signals generated by the second delay circuit.

According to the second aspect of the present invention, there is provided a system clock generating circuit in a semiconductor device having a PLL including a first pulse generator for generating two-phase clocks by using delayed signals, first switching means for switching between a state in which a first clock signal is fed to the PLL, and a state in which a second clock signal is fed to the PLL and a third clock signal is fed to a second delay circuit, and second switching means for selecting any one of the two-phase clocks generated by the first pulse generator and two-phase clocks generated by a pulse generator external to the PLL, and for outputting the selected two-phase clocks as a system clock.

According to the third aspect of the present invention, there is provided a system clock generating circuit in a semiconductor device, in which first switching means includes a switch arranged between a clock input terminal, and a clock output terminal and a reference clock signal input terminal of a PLL, and another switch arranged between the clock input terminal and a second delay circuit.

According to the fourth aspect of the present invention, there is provided a system clock generating circuit in a semiconductor device including switching means for switching between a state in which a first clock signal is fed to a PLL and a second delay circuit, and a state in which a second clock signal is fed to the PLL and a third clock signal is fed to the second delay circuit.

According to the fifth aspect of the present invention, there is provided a system clock generating circuit in a semiconductor device, in which switching means includes a switch arranged between a clock input terminal, and a clock output terminal and a reference clock signal input terminal of a PLL.

The above and further objects and novel features of the present invention will more fully appear from the following detailed description when the same is read in connection with the accompanying drawings. It is to be expressly understood, however, that the drawings are for purpose of illustration only and are not intended as a definition of the limits of the invention.

BRIEF DESCRIPTION OF THE DRAWINGS

FIGS. 18A to 18D are timing diagrams showing the operations of the system clock generating circuit shown in FIG. 16.

DETAILED DESCRIPTION OF THE PREFERRED EMBODIMENTS

A description will now be given of preferred embodiments of the present invention.

Embodiment 1

Figure 1:
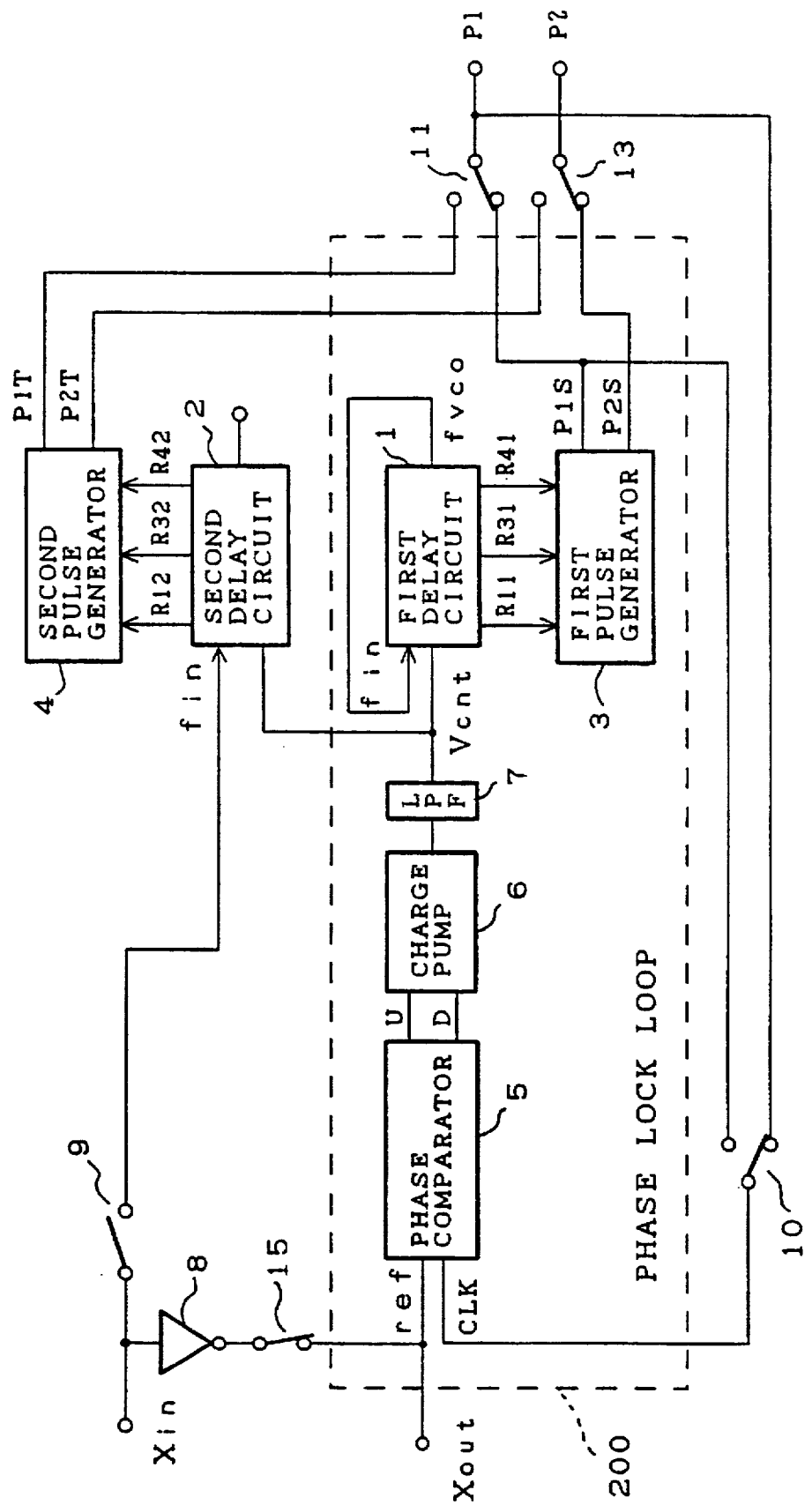
FIG. 1 is a block diagram showing a structure of a system clock generating circuit in a semiconductor device according to an embodiment 1 of the present invention.

FIG. 1 is a block diagram showing a structure of a system clock generating circuit in a semiconductor device according to embodiment 1 of the present invention. In the drawing, reference numeral 200 denotes a phase lock loop (hereinafter referred to as PLL) for outputting two-phase clocks, 2 is a second delay circuit connected to a clock input terminal $X_{in}$ through a switch 9, for outputting signals with frequencies according to control voltage $V_{cnt}$ from a low-pass filter 7, and with predetermined amounts of delay, 4 is a second pulse generator for receiving the signals from predetermined delay stages of the second delay circuit 2 so as to generate a one-phase clock P1T and the other-phase clock P2T, and 15 is a switch arranged between a buffer 8 and a clock output terminal $X_{out}$. In this case, the second pulse generator 4 is equivalent to a pulse generator in a first aspect of the present invention. Further, the switches 9, 15 are illustrative first switching means.

In the PLL 200, reference numeral 1 denotes a first delay circuit for generating a signal $f_{vco}$ with a frequency according to the control voltage $V_{cnt}$ from the low-pass filter 7, and outputting signals having predetermined amounts of delay, and 3 is a first pulse generator for receiving the signals from several delay stages among a plurality of delay stages in the first delay circuit 1 for generating a first-phase clock P1S and the second-phase clock P2S during an actually active time depending upon the received signals. Reference numeral 10 denotes a switch for selecting any one of the first-phase clock P1S from the first pulse generator 3 and a first-phase clock P1 selected by a switch 11, and to feeding the selected clock to a phase comparator 5. The switch 11 selects any one of the clock P1S generated by the PLL 200 and the clock P1T generated by the second pulse generator 4. A switch 13 selects any one of the clock P2S generated by the PLL 200 and the clock P2T generated by the second pulse generator 4.

Figure 14:
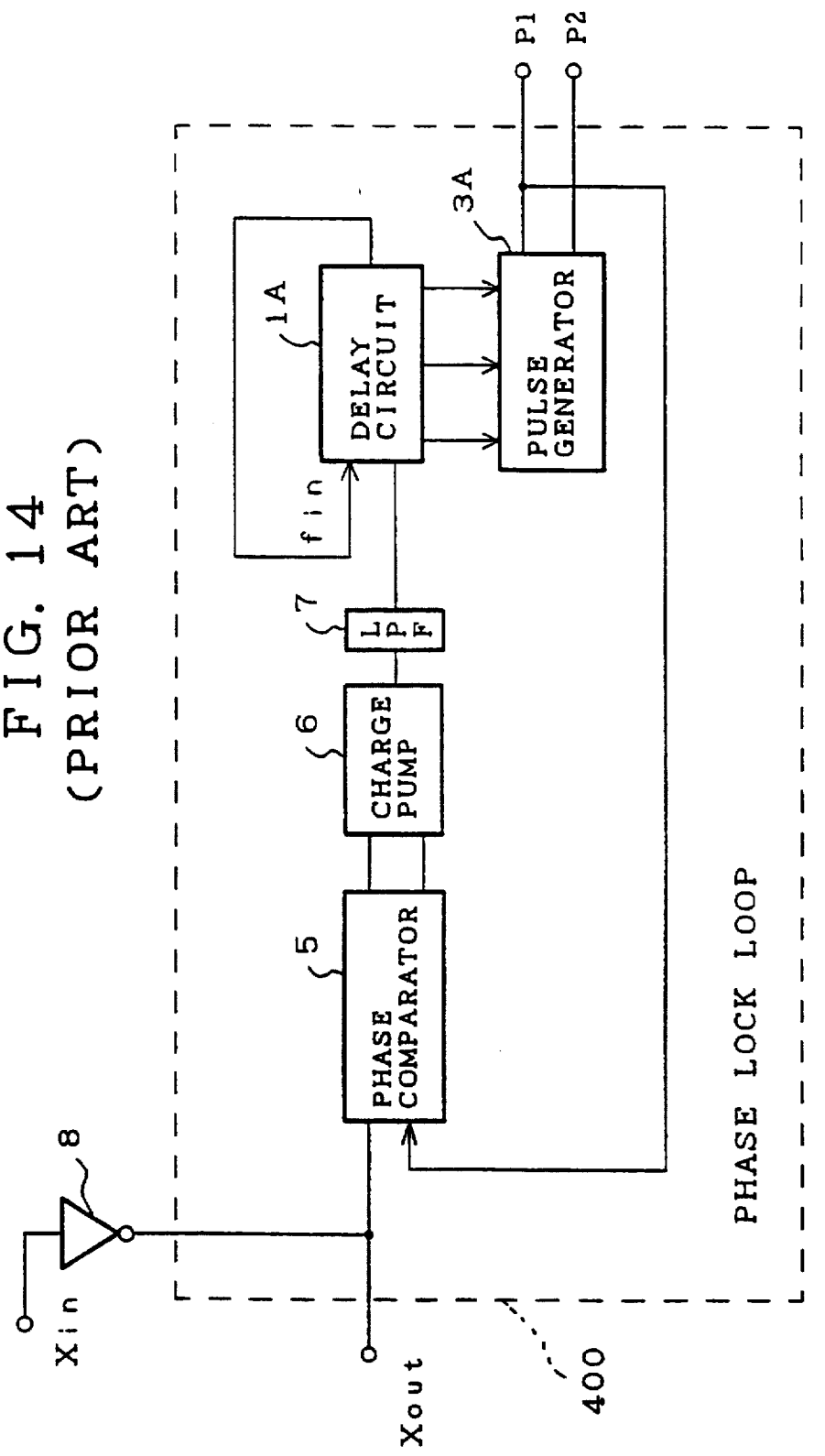
FIG. 14 is a block diagram showing a structure of a conventional system clock generating circuit in a semiconductor device.
Figure 15:
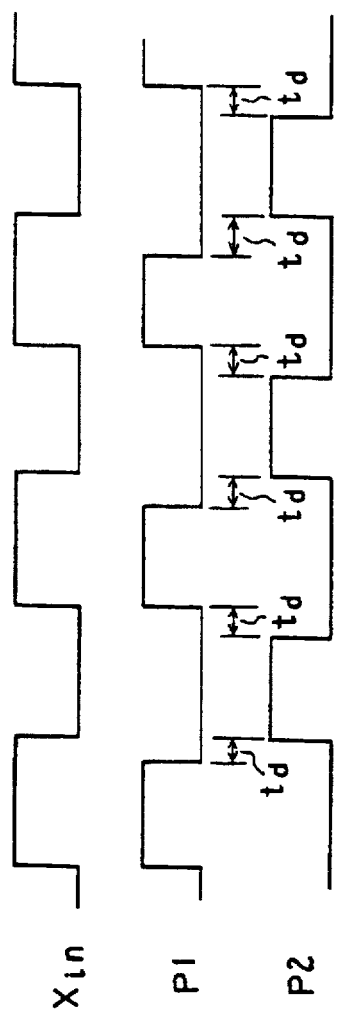
FIGS. 15A to 15D are timing diagrams showing the operations of the system clock generating circuit shown in FIG. 14.
Figure 16:
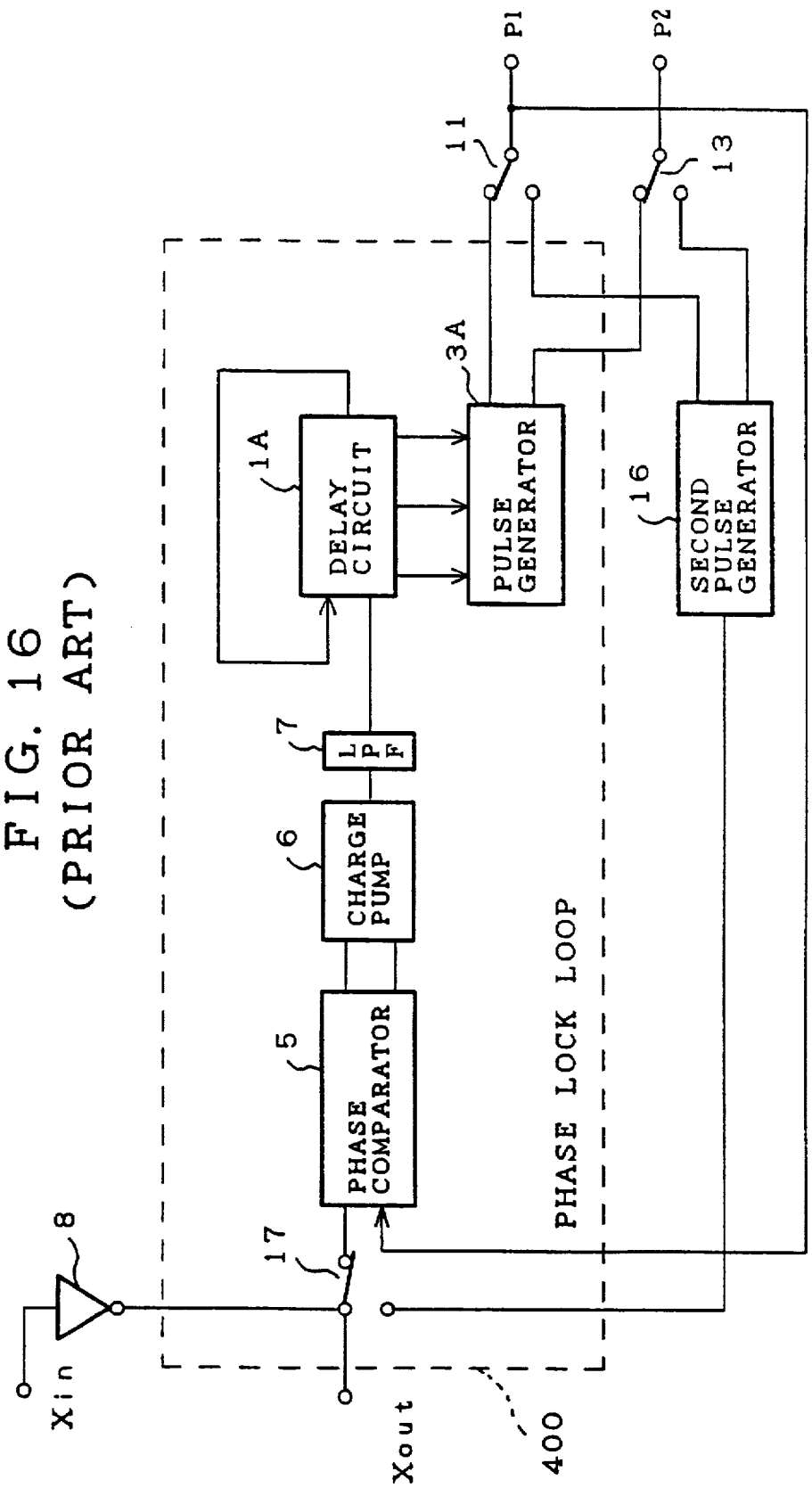
FIG. 16 is a block diagram showing a structure of another conventional system clock generating circuit in a semiconductor device.
Figure 17:
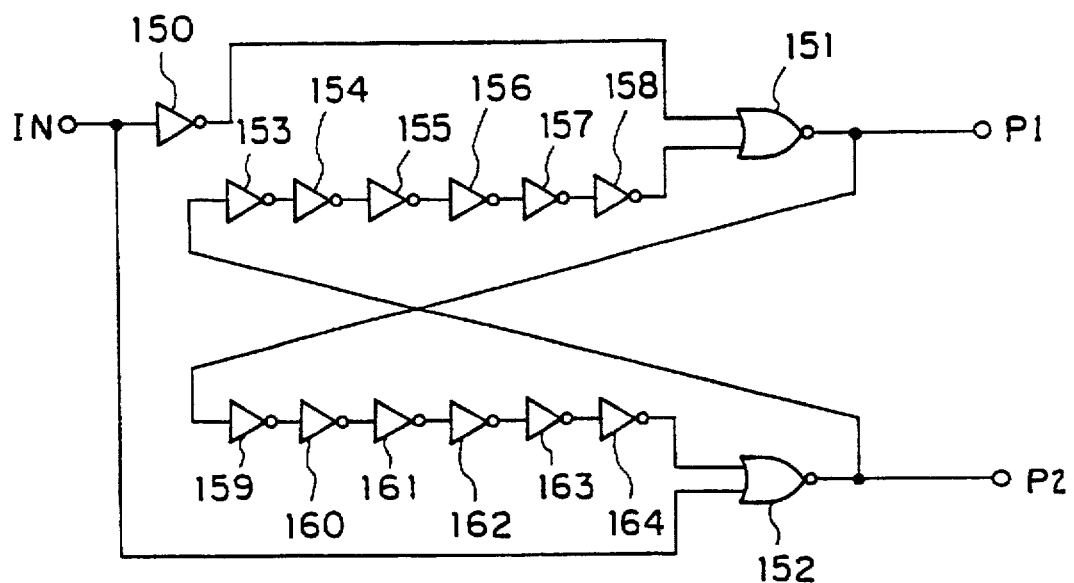
FIG. 17 is a circuit diagram showing one illustrative structure of a pulse generator shown in FIG. 16.

Other component parts are identical with those shown in FIG. 14, and the switches 11, 13 are illustrative second switching means.

Figure 2:
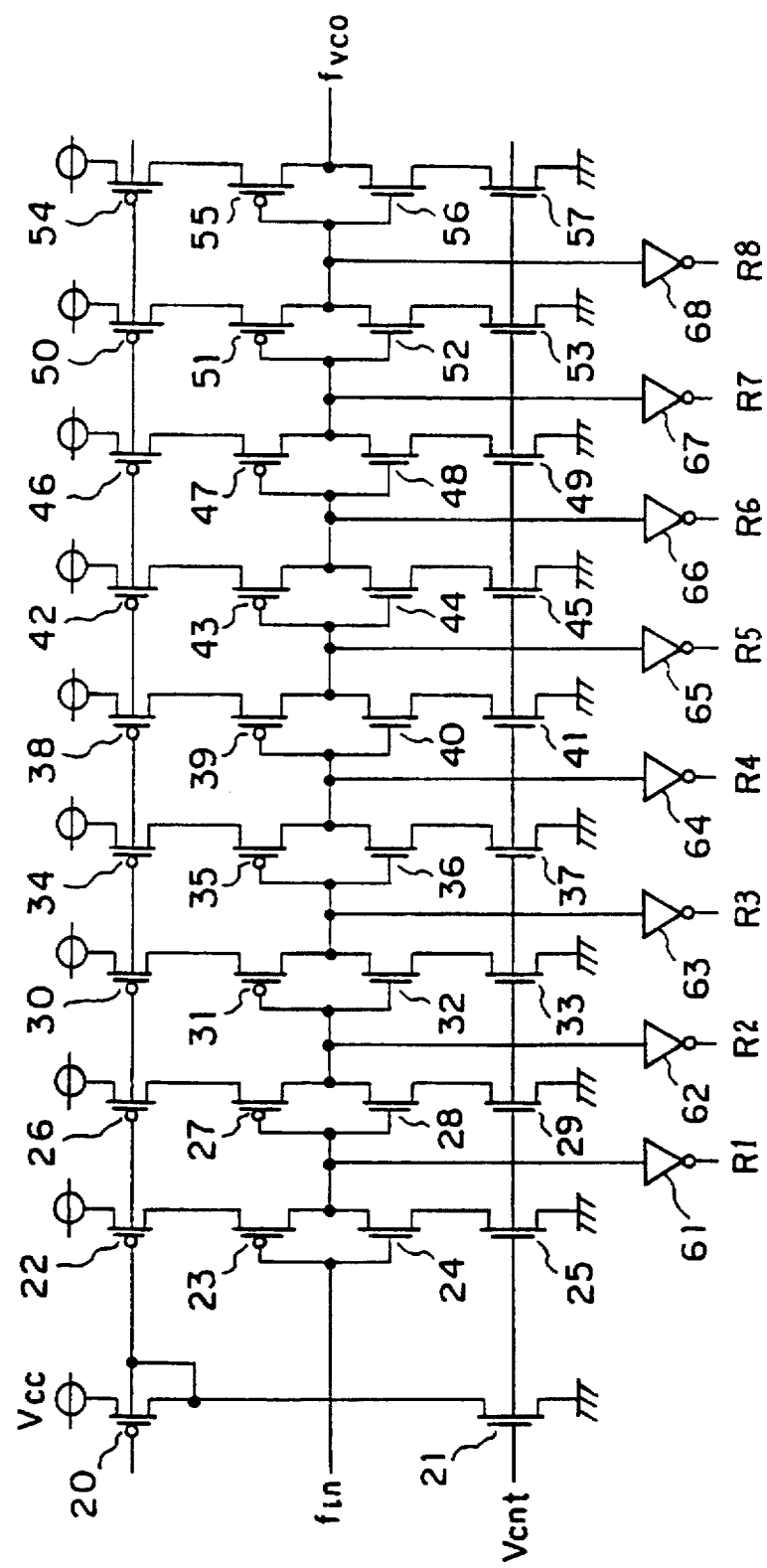
FIG. 2 is a circuit diagram showing one illustrative structure of a first delay circuit and a second delay circuit.

FIG. 2 is a circuit diagram showing one illustrative structure of the first delay circuit and the second delay circuit. As shown in the drawing, the first delay circuit 1 and the second delay circuit 2 have, for example, ten P-channel transistors 20, 22, 26, 30, 34, 38, 42, 46, 50, and 54 with drains connected to a power source Vcc, and with gates connected to a drain of an N-channel transistor 21. A source of the P-channel transistor 20 is connected to the gates. Further, the first delay circuit 1 and the second delay circuit 2 have inverters including the P-channel transistors 23, 27, 31, 35, 39,. 43, 47, 51, and 55, and the N-channel transistors 24, 28, 32, 36, 40, 44, 48, 52, and 56. A signal $f_{in}$ is applied to the inverter in the first stage, and the inverters are cascaded. The N-channel transistors 24, 28, 32, 36, 40, 44, 48, 52, and 56 of the inverters are connected to drains of the N-channel transistors 25, 29, 33, 37, 41, 45, 49, 53, and 57, respectively. Further, the control voltage $V_{cnt}$ is applied to gates of the N-channel transistors 21, 25, 29, 33, 37, 41, 45, 49, 53, and 57.

Outputs from the inverters are respectively sent as outputs R1 to R8 through the inverters 61 to 68, respectively. When the circuit shown in FIG. 2 is applied to the first delay circuit 1, output from the inverter in a final stage becomes a signal $f_{vco}$. The signal $f_{vco}$ is fed back as the signal $f_{in}$ to the inverter in the first stage. When the circuit shown in FIG. 2 is applied to the second delay circuit 2, an output terminal of the inverter in a final stage is kept open.

In the above circuit, the nine inverters can serve as delay elements. Further, when the signal $f_{vco}$ is fed back as the signal $f_{in}$, the circuit can serve as a ring oscillator. The P-channel transistors 20, 22, 26, 30, 34, 38, 42, 46, 50, and 54, and the N-channel transistors 21, 25, 29, 33, 37, 41, 45, 49, 53, and 57 can control the amount of delay according to the control voltage $V_{cnt}$ by controlling current flowing in the inverters.

When the circuit shown in FIG. 2 is applied to the first delay circuit 1, the outputs R1 to R8 correspond to outputs R11, R21, R31, R41, R51, R61, R71, and R81, respectively. When the circuit shown in FIG. 2 is applied to the second delay circuit 2, the outputs R1 to R8 correspond to outputs R12, R22, R32, R42, R52, R62, R72, and R82, respectively.

It must be noted that the circuit shown in FIG. 2 is one illustrative delay circuit, and the first delay circuit 1 and the second delay circuit 2 may be formed according to another circuit configuration. Further, though the illustrative delay elements are formed in the nine stages, the delay elements may be formed in an arbitrary number of stages as long as the number of stages is an odd number. The number of stages of the delay elements is determined according to the desired oscillation frequency and accuracy desired for skew.

Figure 3:
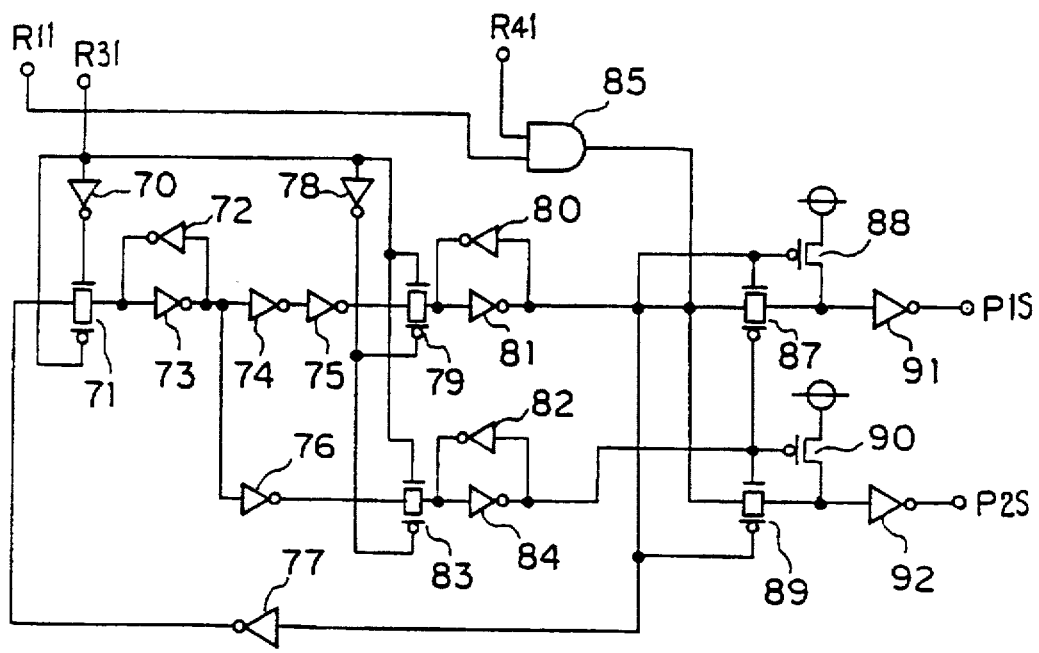
FIG. 3 is a circuit diagram showing one illustrative structure of a first pulse generator.

FIG. 3 is a circuit diagram showing one illustrative structure of the first pulse generator. As an example, a description will be given of a case where the first pulse generator 3 receives the outputs R11, R31, and R41 from the first delay circuit 1. As shown in the drawing, the first pulse generator 3 has an AND circuit 85 in which the output R11 and the output R41 are ANDed. Further, the first pulse generator 3 is provided with a transmission gate 87 and a P-channel transistor 88 which pass the output from the AND circuit 85 under a predetermined condition, and an inverter 91 to provide the one-phase clock signal P1S by inverting the output passing through the transmission gate 87. Further, the first pulse generator 3 has a transmission gate 89 and a P-channel transistor 90 which pass the output from the AND circuit 85 under a predetermined condition, and an inverter 92 to provide the other-phase clock signal P2S by inverting the output passing through the transmission gate 89.

In addition, the first pulse generator 3 has three D-latches controlled by the output R31, to create a passing condition. The first D-latch includes an inverter 70 to invert the output R31, a transmission gate 71, and two inverters 72 and 73 which are controlled by the output R31. The second D-latch includes an inverter 78 to invert the output R31, a transmission gate 79, and two inverters 80 and 81 which are controlled by the output R31. The third D-latch includes a transmission gate 83, and two inverters 82 and 84 which are controlled by the output R31. Output of the first D-latch is transmitted to the second D-latch through two inverters 74, 75 without logical inversion. Further, the output of the first D-latch is transmitted to the third D-latch through an inverter 76 after the logical inversion.

Output of the third D-latch is transmitted to the first D-latch through an inverter 77 after the logical inversion.

The circuit shown in FIG. 3 generates the two-phase clock signals P1S, P2S with frequencies which are half the frequency of the signal $f_{vco}$. Further, it must be noted that the circuit shown in FIG. 3 is one illustrative pulse generator, and the first pulse generator 3 may be formed according to another circuit configuration.

Figure 4:
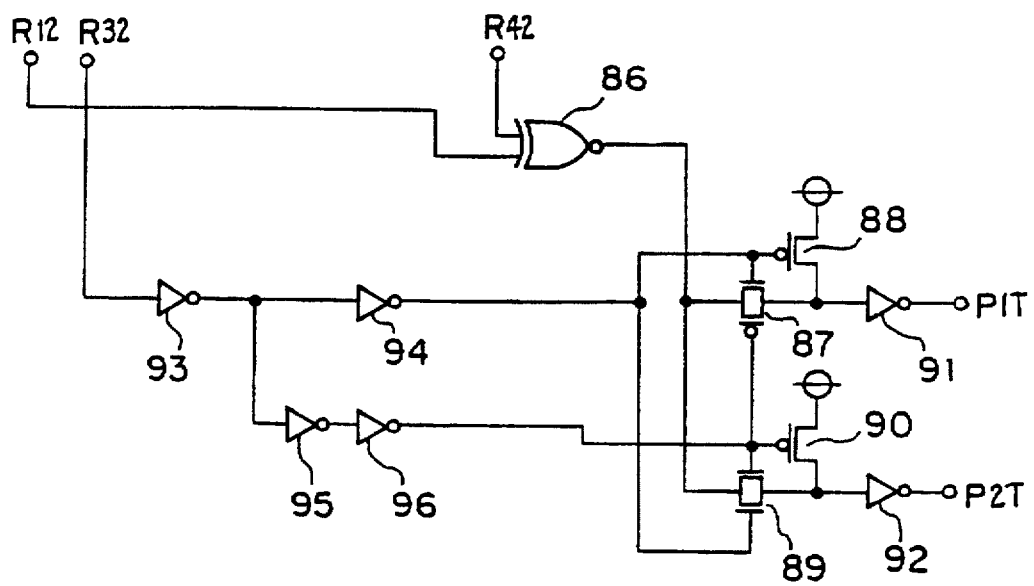
FIG. 4 is a circuit diagram showing one illustrative structure of a second pulse generator.

FIG. 4 is a circuit diagram showing one illustrative structure of the second pulse generator. As an example, a description will be given of a case where the second pulse generator 4 receivers the outputs R12, R32, and R42 of the second delay circuit 2. As shown in the drawing, the second pulse generator 4 has an exclusive NOR circuit (EXNOR circuit) 86 to invert an exclusive NOR of the output R12 and the output R42. Further, the second pulse generator 4 is provided with a transmission gate 87 and a P-channel transistor 88 which pass the output of the EXNOR circuit 86 under a predetermined condition, and an inverter 91 to provide the one-phase clock signal P1T by inverting the output passing through the transmission gate 87. Additionally, the second pulse generator 4 has a transmission gate 89 and a P-channel transistor 90 which pass the output from the EXNOR circuit 86 under a predetermined condition, and an inverter 92 to provide 10 the other-phase clock signal P2T by inverting the output passing through the transmission gate 89. Further, the second pulse generator 4 has two inverters 93, 94 to pass the output R32 so as to create a passing condition, and two-stage inverters 95, 96 for receiving the output of the inverter 93.

It must be noted that the circuit shown in FIG. 4 is one illustrative pulse generator, and the second pluse generator 4 may be formed according to another circuit configuration.

Figure 5:
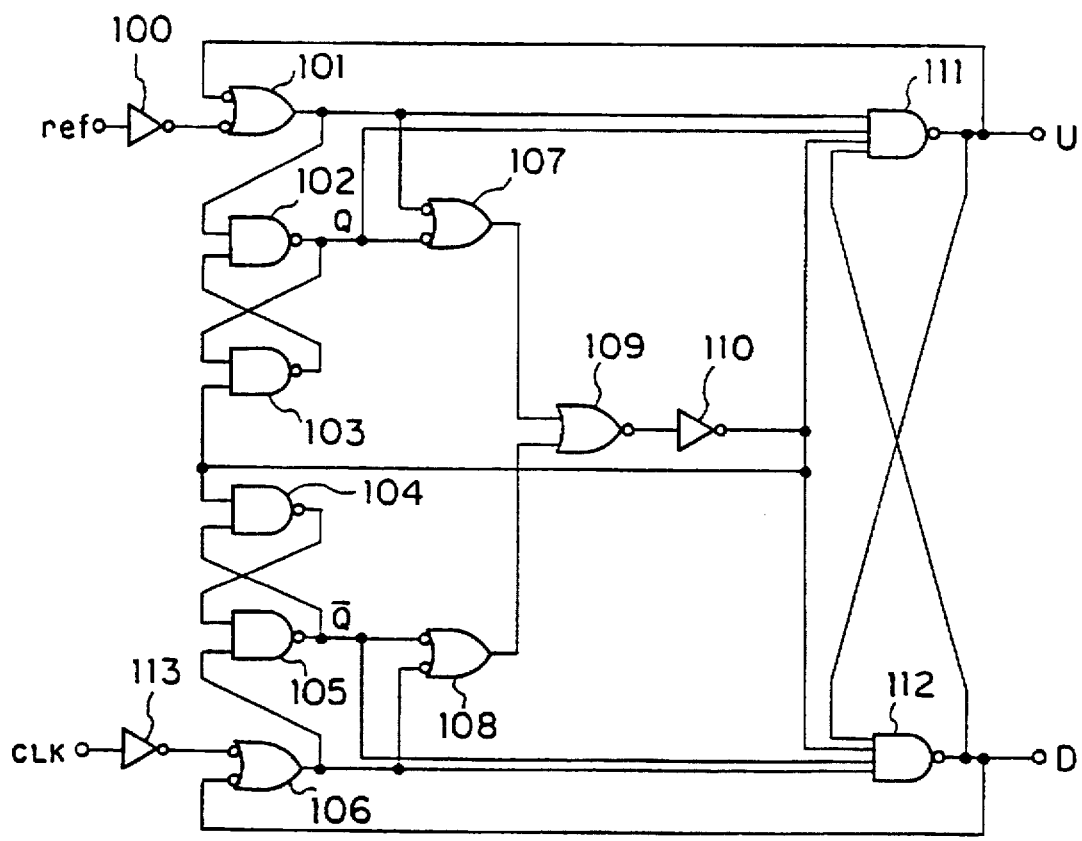
FIG. 5 is a circuit diagram showing one illustrative structure of a phase comparator.

FIG. 5 is a circuit diagram showing one illustrative structure of the phase comparator. In the illustration, the phase comparator 5 has an inverter 100 for receiving the reference clock signal ref, an inverter 113 for receiving a clock signal CLK, a NAND circuit 101 receiving as inputs, the output of the inverter 100 and the output of an inverted AND circuit (NAND circuit) 111, and a NAND circuit 106 receiving as inputs output of the inverter 113 and output of a NAND circuit 112. Further, the phase comparator 5 has a first flip-flop including two NAND circuits 102 and 103 receiving as a set input, the output of the NAND circuit 101, and a second flip-flop including two NAND circuits 104 and 105 receiving as a reset input, the output of the NAND circuit 106. In a NAND circuit 107, the output of the NAND circuit 101 and the Q output of the first flip-flop are ANDed. In a NAND circuit 108, the output of the NAND circuit 106 and the inverted Q output of the second flip-flop are ANDed. Subsequently, in a NOR circuit 109 and an inverter 110, the outputs of the two NAND circuits 107, 108 are ORed.

The NAND circuit 111 receives as inputs, the outputs of the NAND circuit 101, the NAND circuit 102, the inverter 110, and the NAND circuit 112. The NAND circuit 112 receives as inputs, the outputs of the NAND circuit 106, the NAND circuit 105, the inverter 110, and the NAND circuit 111. The output of the NAND circuit 111 serves as a U signal to instruct the charge pump 6 to increase voltage, and the output of the NAND circuit 112 serves as a D signal to instruct the charge pump 6 to decrease the voltage.

It must be noted that the circuit shown in FIG. 5 is one illustrative phase comparator, and the phase comparator 5 may be formed according to another circuit configuration.

Figure 6:
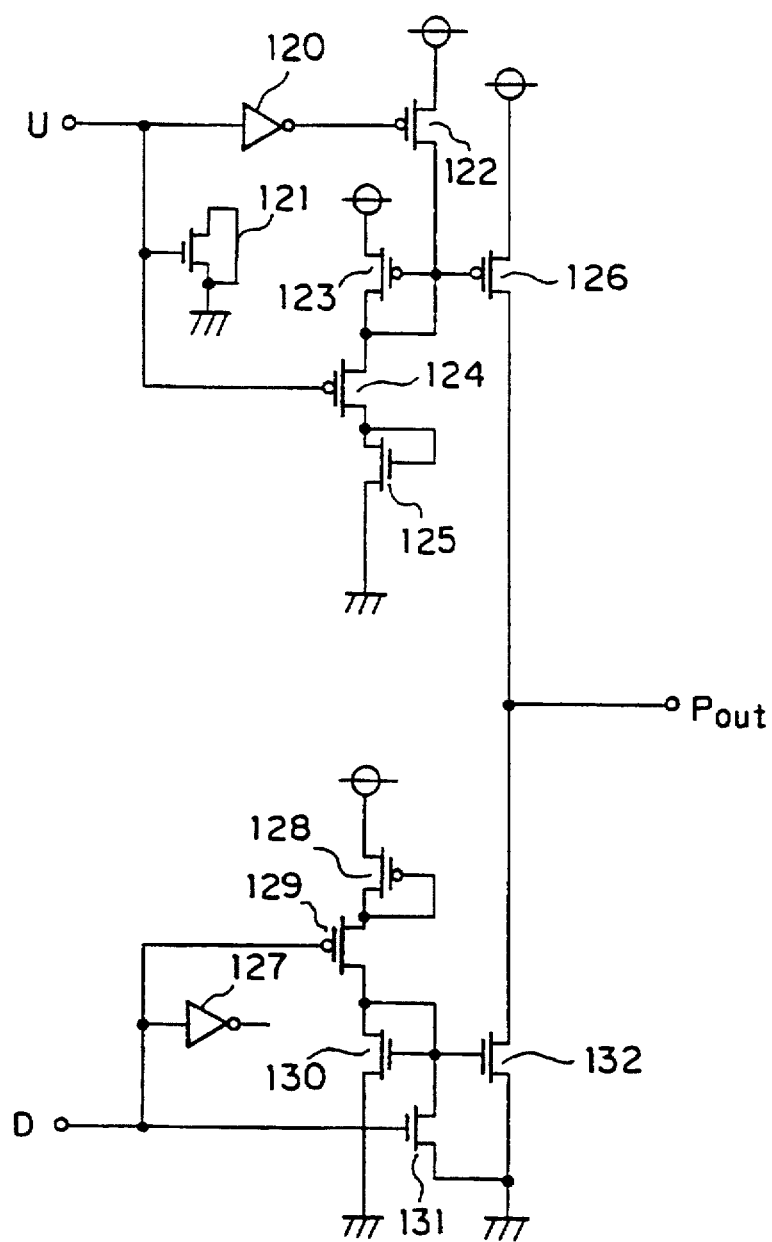
FIG. 6 is a circuit diagram showing one illustrative structure of a charge pump.

FIG. 6 is a circuit diagram showing one illustrative structure of the charge pump. In the illustration, the charge pump 6 has a circuit configuration in which a high signal is output when the U signal becomes low, and a low signal is output when the D signal becomes low. That is, the charge pump 6 is provided with a P-channel transistor 122 in which an inverted U signal is applied to a gate, P-channel transistors 123 and 126 with gates connected to a source terminal of the P-channel transistor 122, a P-channel transistor 124 with a drain terminal connected to the gates of the P-channel transistors 123 and 126, in which the U signal is applied to a gate, an N-channel transistor 125 connected between the P-channel transistor 124 and ground potential, and an N-channel transistor 121 arranged between an input terminal for the U signal and the gate of the P-channel transistor 124.

Further, the charge pump 6 is provided with a P-channel transistor 129 in which the D signal is applied to a gate, a P-channel transistor 128 connected between a drain of the P-channel transistor 129 and a power source, N-channel transistors 130 and 132 with gates connected to a source of the P-channel transistor 129, and an N-channel transistor 131 with a drain terminal connected to the gates of the N-channel transistors 130 and 132 and with a gate to which the D signal is applied. In this case, an input terminal for the D signal is provided with an inverter 127 to provide a load capacitance identical with a U-side load capacitance, that is, to compensate for an inverter 120.

It must be noted that the circuit shown in FIG. 6 is an illustrative charge pump, and the charge pump 6 may be formed according to another circuit configuration. In the low-pass filter 7 having a structure shown in FIG. 7, a capacitor 141 is charged and discharged through a resistor 140 by a voltage instruct signal $P_{out}$ output from the charge pump 6. The voltage of the capacitor 141 is supplied as the control voltage $V_{cnt}$ to the first delay circuit 1 and the second delay circuit 2.

A description will now be given of the operation.

Elements are selected such that the elements in the first delay circuit 1 have electrical characteristics identical with electrical characteristics of the corresponding elements in the second delay circuit 2.

During an actually active time of the semiconductor device, the switch 15 is kept closed, and the switch 9 is kept opened. Further, the switches 11, 13 are set to output the two-phase clocks P1S, P2S generated by the first pulse generator 3. Thus, the clocks P1S and P2S are fed to each section of the semiconductor device as the two-phase clocks P1, P2 serving as a system clock. Further, the switch 10 is set to connect an output terminal for the clock P1 to an input terminal for the clock signal CLK of the phase comparator 5.

Figure 8:
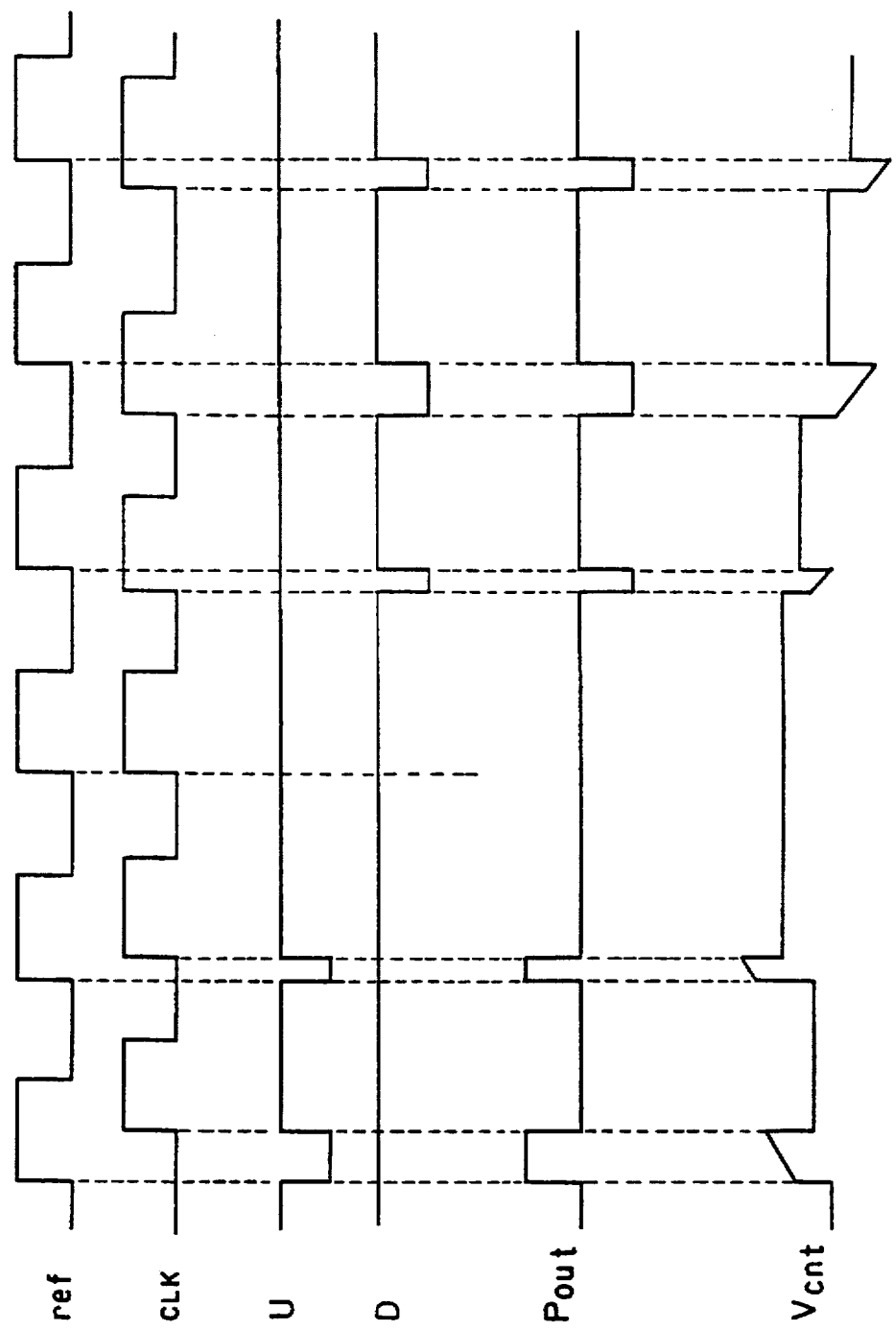
FIG. 8 is a timing diagram showing operation timing of the phase comparator and the charge pump.

A clock signal is inputted to the clock input terminal $X_{in}$. Here, as an example, a description will be given of a case where a clock signal of 25 MHz is input. The clock signal is fed as the reference clock signal ref to the phase comparator 5 through the buffer 8. The clock P1S is fed as the clock signal CLK to the other input terminal of the phase comparator 5. As shown in FIG. 8, when a phase of the clock P1S lags behind a phase of the reference clock signal ref, the phase comparator 5 having the structure as shown in FIG. 5 sets the U signal in a significant state. In the example, the U signal is set to low. When the phase of the clock P1S leads the phase of the reference clock signal ref, the phase comparator 5 sets the D signal in a significant state. That is, the D signal is set to low. When the clock P1S and the reference clock signal ref are in phase, neither the U signal nor the D signal is set in the significant state.

In the charge pump 6 having the structure as shown in FIG. 6, when the U signal is significant, the P-channel transistor 126 conducts, and, as shown in FIG. 8, a high voltage instruct signal $P_{out}$ is developed at an output terminal of the charge pump 6. When the D signal is significant, the N-channel transistor 132 conducts, and, as shown in FIG. 8, a low voltage instruct signal $P_{out}$ is developed at the output terminal of the charge pump 6. When neither the U signal nor the D signal is significant, neither the P-channel transistor 126 nor the N-channel transistor 132 conducts. Then, as shown by $P_{out}$ in FIG. 8, neither the high signal nor the low signal is developed at the output terminal of the charge pump 6.

Figure 7:
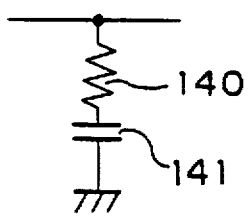
FIG. 7 is a circuit diagram showing one illustrative structure of a low-pass filter.

The voltage instruct signal Pout charges and discharges the capacitor 141 of the low-pass filter 7 having the structure as shown in FIG. 7. Therefore, when the phase of the clock P1S lags behind the phase of the reference clock signal ref, the control voltage $V_{cnt}$ serving as voltage of the capacitor 141 is increased. When the phase of the clock P1S leads the phase of the reference clock signal ref, the control voltage $V_{cnt}$ is reduced. When the clock P1S and the reference clock signal ref are in phase, the control voltage $V_{cnt}$ is kept constant.

The first delay circuit 1 forms a ring oscillator controlled by voltage, and forms the delay circuit. In the delay circuit 1 having the structure as shown in FIG. 2, the control voltage $V_{cnt}$ is applied to the P-channel transistors 20, 22, 26, 30, 34, 38, 42, 46, and 50, and the N-channel transistors 21, 25, 29, 33, 37, 41, 45, 49, and 53. Thus, a variation is caused in current flowing in the inverters of the first delay circuit 1 according to magnitude of the control voltage $V_{cnt}$. The variation in current varies the amount of delay, thereby varying the oscillation frequency and the amounts of delay in the delay stages. As set forth above, the first pulse generator 3 has the function of dividing a frequency in half. If synchronization is established in the PLL 200, the output signal $f_{vco}$ is stabilized at a frequency of 50 MHz which is twice 25 MHz, the frequency of the clock P1S. Further, the control voltage $V_{cnt}$ is stabilized at voltage at a time when the clock signal CLK input to the phase comparator 5 is stabilized at a frequency of 25 MHz. Therefore, the establishment of the synchronization results in stabilization of the amounts of delay in the delay stages.

Figure 9:
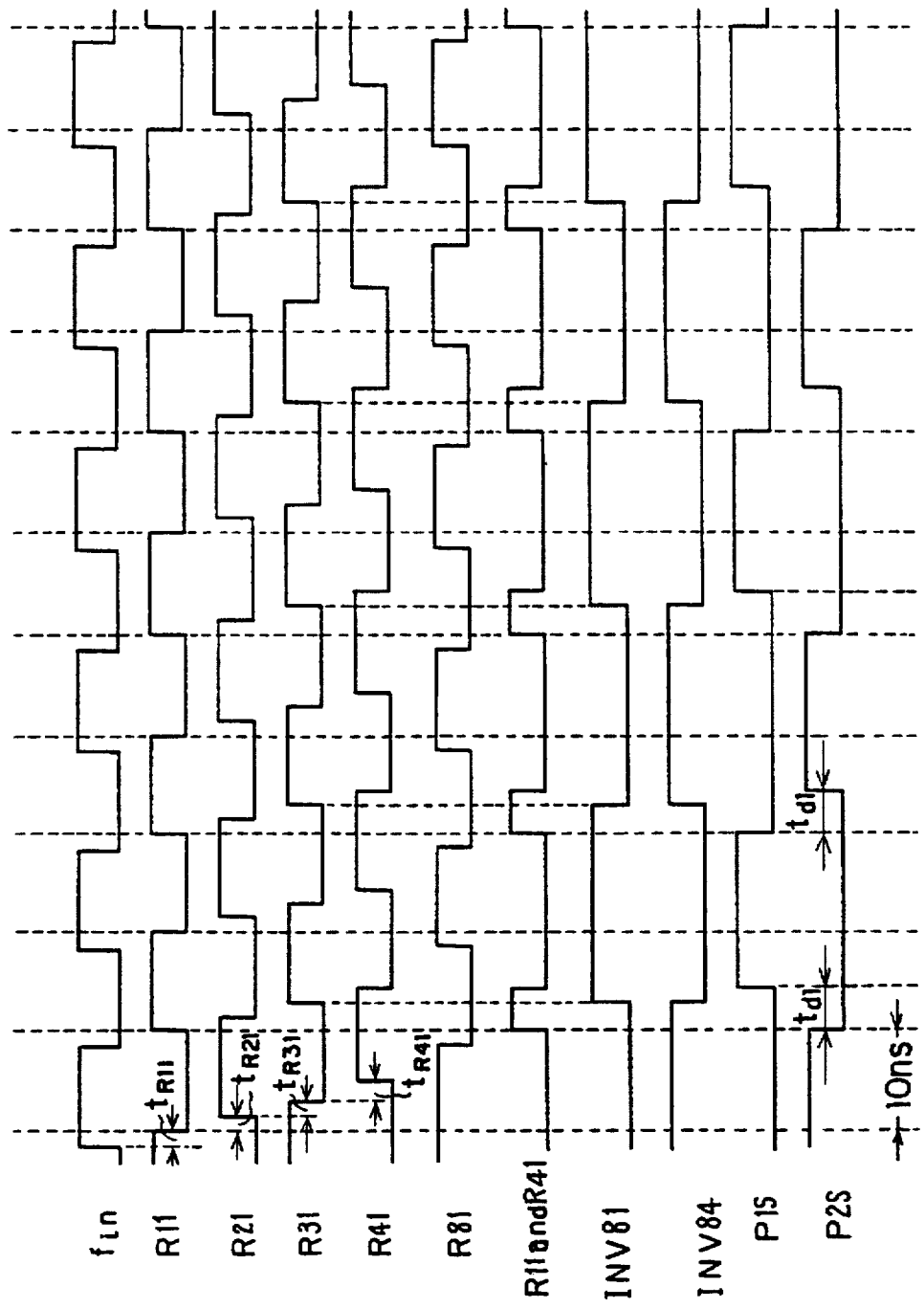
FIG. 9 is a timing diagram showing operation timing of the first pulse generator.

FIG. 9 is a timing diagram showing waveforms of sections in the first delay circuit 1 and the first pulse generator 3. It must be noted that the outputs R51, R61, and R71 are not shown in FIG. 9.

The first pulse generator 3 having the structure as shown in FIG. 3 introduces the outputs R11, R31, and R41 from, for example, the first delay circuit 1. From which delay stage the first pulse generator 3 fetches a signal is determined according to a required amount of skew. In this case, the output R11 and the output R41 are ANDed in the AND circuit 85, and the output of the AND circuit 85 passes through the transmission gates 87, 89 by control of outputs from the inverters 81 and 84. The outputs of the transmission gates 87 and 89 are turned into the two-phase clocks P1S and P2S through the inverters 91 and 92. As set forth above, as shown in FIG. 9, it is possible to provide the stable two-phase clocks P1S and P2S with a phase difference $t_d$ according to the amounts of delay caused by the three delay stages in the first delay circuit 1.

The two-phase clocks P1S, P2S are fed as the system clock to each section in the semiconductor device through the switches 11, 13.

In testing the semiconductor device, the switch 15 is kept open, and the switch 9 is kept closed. Further, the switches 11 and 13 are set to output the two-phase clocks P1T, P2T generated by the second pulse generator 4. Thus, the clocks P1T, P2T are output as the two-phase clocks P1, P2. The switch 10 is set such that the one-phase clock P1S from the first pulse generator 3 can be directly input to the input terminal for the clock signal CLK of the phase comparator 5.

Subsequently, a clock signal is input to the clock input terminal $X_{in}$, and a clock signal is inputted to the clock input terminal $X_{out}$. For example, the clock signal of 25 MHz is input to the clock input terminal $X_{in}$, and another clock signal of 25 MHz is input to the clock input terminal $X_{out}$. Thus, in this case, the clock signal input to the clock input terminal $X_{out}$ is used as the reference clock signal to establish synchronization in the PLL 200. The reference clock signal has the same frequency as that of a reference clock signal during the actually active time of the semiconductor device. Therefore, the control voltage $V_{cnt}$ when synchronization is established in the PLL 200 is identical with the control voltage $V_{cnt}$ at the actually active time of the semiconductor device.

Figure 10:
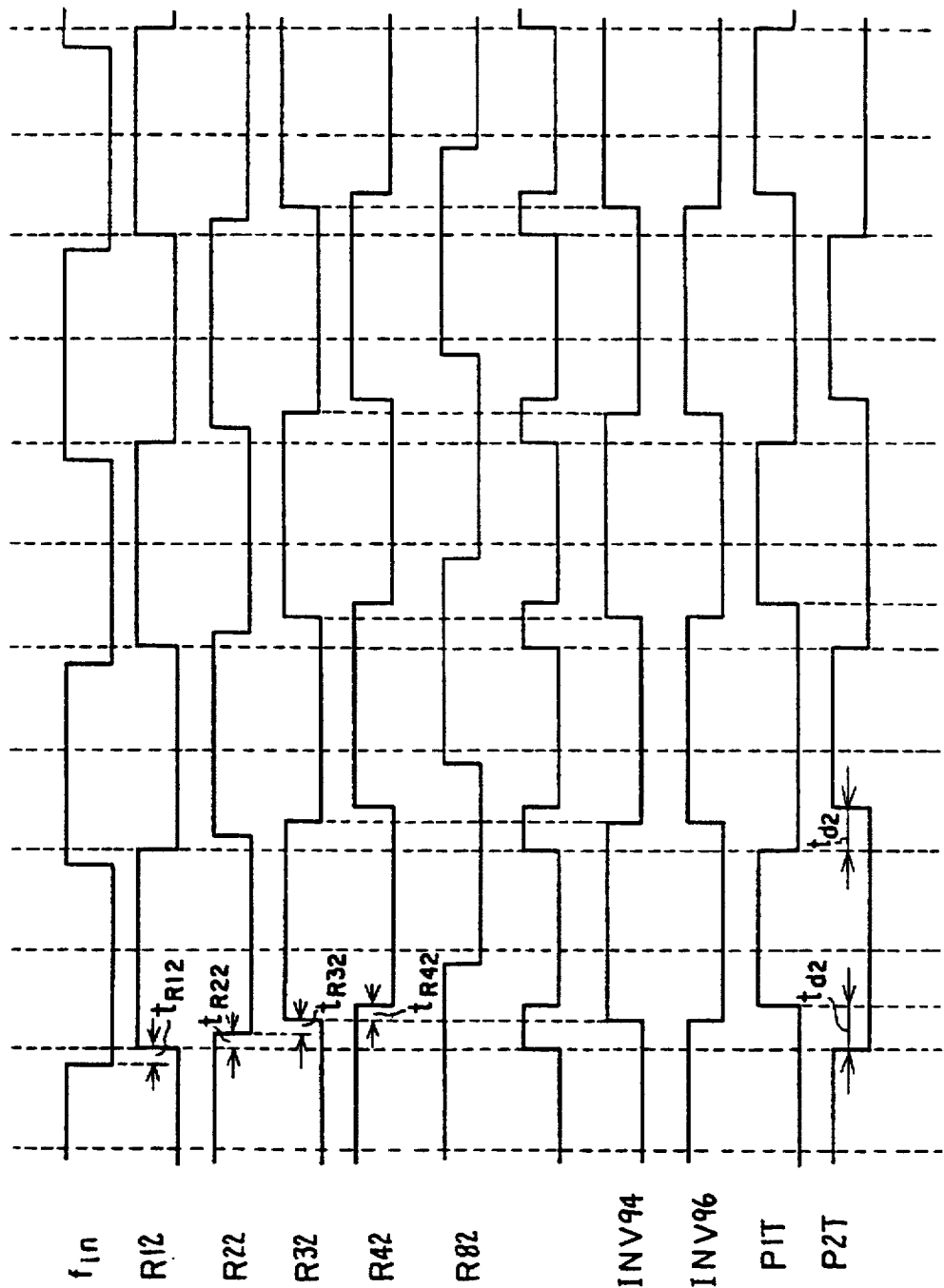
FIG. 10 is a timing diagram showing operation timing of the second pulse generator.

The control voltage $V_{cnt}$ at the time when the synchronization is established in the PLL 200 is input to the second delay circuit 2 as well as the first delay circuit 1. The second delay circuit 2 has the same structure as that of the first delay circuit 1. That is, in the second delay circuit 2 having the structure as shown in FIG. 2, the control voltage $V_{cnt}$ is applied to the P-channel transistors 20, 22, 26, 30, 34, 38, 42, 46, and 50, and the N-channel transistors 21, 25, 29, 33, 37, 41, 45, 49, and 53. The elements in the first delay circuit 1 have electrical characteristics identical with those of the corresponding elements in the second delay circuit 2. Hence, when the synchronization is established in the PLL 200, the delay stages in the second delay circuit 2 have the same amounts of delay as those of the delay stages in the first delay circuit 1. That is, the amounts of delay $t_{R12}$, $t_{R22}$, $t_{R32}$, and $t_{R42}$ shown in FIG. 10 are equivalent to the amounts of delay $t_{R11}$, $t_{R21}$, $t_{R31}$, and $t_{R41}$ shown in FIG. 9. Though FIGS. 9 and 10 illustrate only the amounts of delay at clock leading edges, it is to be noted that amounts of delay at clock trailing edges in the outputs R12, R22, R32, and R42 are equivalent to amounts of delay at clock trailing edges in the outputs R11, R21, R31, and R41.

The second pulse generator 4 having the structure shown in FIG. 4 receives the outputs R12, R32, and R42 from the second delay circuit 2. In the second pulse generator 4, the output R12 and the output R 42 are exclusively ORed in the EXNOR circuit 86, and the output from the EXNOR circuit 86 passes through the transmission gates 87 and 89. Outputs of the transmission gates 87 and 89 are turned into the two-phase clocks P1T, P2T through the inverters 91 and 92. As set forth above, as shown in FIG. 10, it is possible to provide the two-phase clocks P1T, P2T with a phase difference $t_{d2}$ according to the amounts of delay caused by the three delay stages in the second delay circuit 2. The phase difference $t_{d2}$ is equivalent to the phase difference $t_{d1}$ shown in FIG. 9.

The clocks P1T and P2T pass through the switches 11 and 13 to be fed as the system clock to each section in the semiconductor device.

Figure 11:
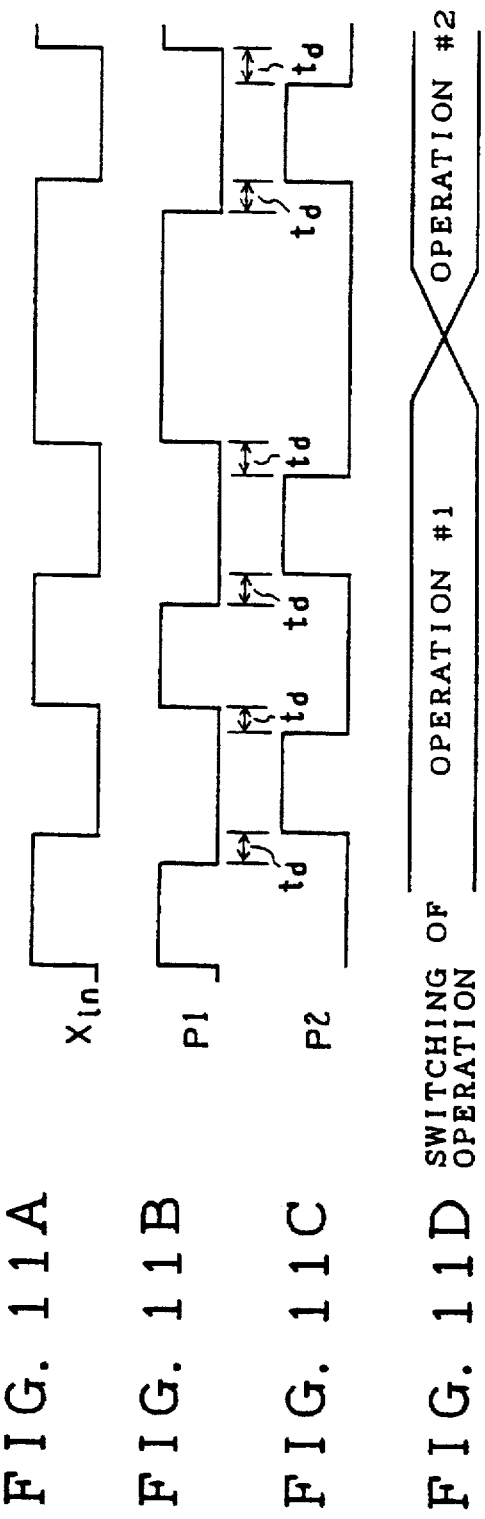
FIGS. 11A to 11D are timing diagrams showing the operations of the system clock generating circuits in the semiconductor device according to embodiments 1 and 2 of the present invention.

During a test, a predetermined signal for the test is fed, for example, at a time of transition from the operation #1 to the operation #2 in FIG. 11D. As set forth above, if the signal is unconditionally fed, a waveform of the signal may have rounding due to the capacitance of wiring or the like, and the signal for the test may not be set in the semiconductor device at a desired timing. Hence, when the predetermined signal is fed to the semiconductor device, the clock signal input to the input terminal $X_{in}$ is interrupted, or a frequency of the clock signal is reduced. Subsequently, the predetermined signal is input to the semiconductor device, thereafter resuming input of the clock signal to the input terminal $X_{in}$, or restoring the clock signal to its original frequency.

Since the PLL 200 is continuously operated, the control voltage $V_{cnt}$ is stabilized at a value identical to a value at the actually active time. Therefore, the amount of delay $t_{d2}$ of each delay stage in the second delay circuit 2 is equivalent to the amount of delay $t_d$ during the actually active time, and remains constant. That is, no variation is caused in skew of the two-phase clocks P1T and P2T even when a variation is caused in the frequency of the clock signal input to the input terminal $X_{in}$. In addition, even when the clock signal is restored to the original frequency, the skew remains constant. As a result, when the predetermined signal for the test is fed, the set signal can normally be propagated in the semiconductor device.

As stated above, according to embodiment 1, no variation is caused in the skew of the system clock when the predetermined signal for testing is input to the semiconductor device. As a result, the predetermined signal can correctly be set in the semiconductor device so that an accurate test can be made on the semiconductor device. For example, an accurate test can be made even when the operation is changed in a semiconductor device such as a microprocessor.

Embodiment 2

Figure 12:
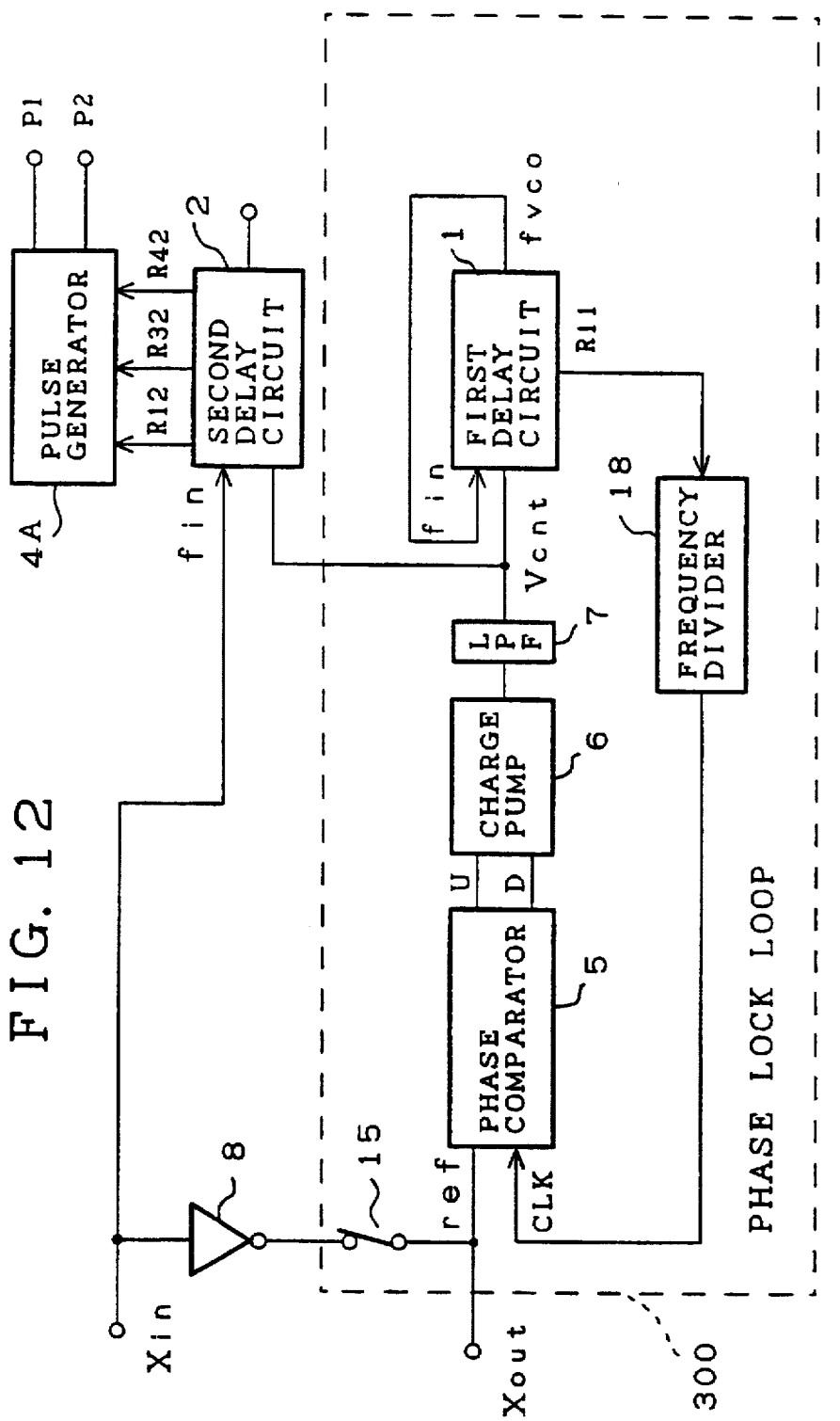
FIG. 12 is a block diagram showing a structure of the system clock generating circuit in the semiconductor device according to the embodiment 2 of the present invention.

FIG. 12 is a block diagram showing a structure of a system clock generating circuit in a semiconductor device according to embodiment 2 of the present invention. In the drawing, reference numeral 300 denotes a phase lock loop (hereinafter referred to as PLL) for outputting two-phase clocks, and 4A is a pulse generator having the same structure as that of the second pulse generator 4 shown in FIG. 1. In this case, the PLL 300 is provided with a frequency divider 18 to halve an input frequency between a first delay circuit 1 serving as a VCO and a phase comparator 5. Other component parts are identical to those shown in FIG. 1, and a switch 15 is an illustrative switching means. Unlike the structure shown in FIG. 1, there are no switches 9, 10, 11, and 13 in the embodiment.

Figure 13:
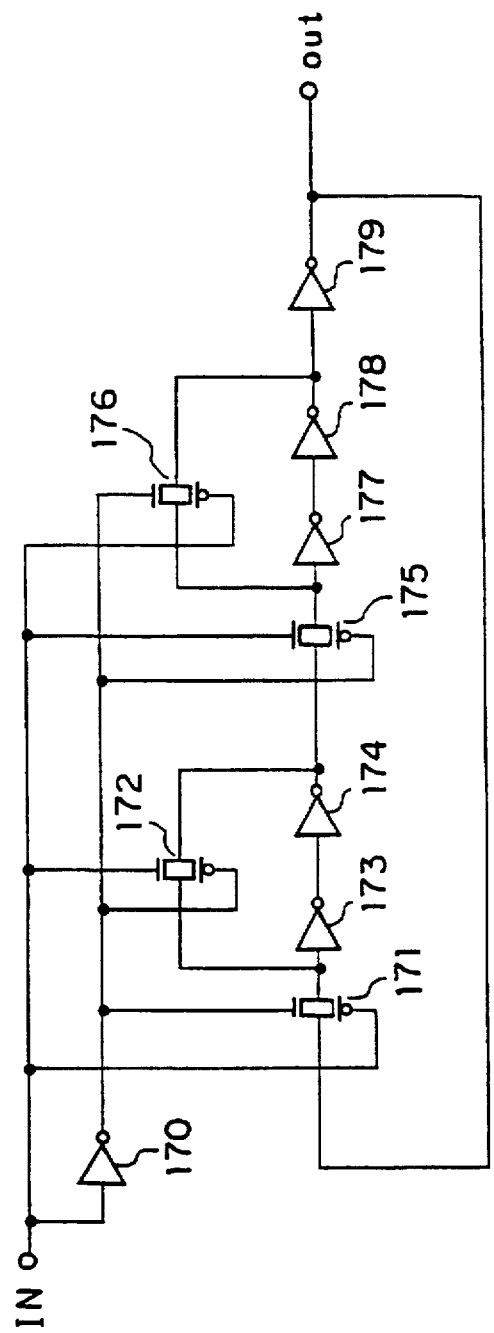
FIG. 13 is a circuit diagram showing one illustrative structure of a frequency divider.

FIG. 13 is a circuit diagram showing one illustrative structure of the frequency divider. In the illustration, the frequency divider 18 includes flip-flops in two stages. The first-stage flip-flop includes two inverters 173 and 174, a transmission gate 172 for returning the output of the inverter 174 to the inverter 173 under a predetermined condition, and a transmission gate 171 for applying the output of the second-stage flip-flop to the inverter 173 under a predetermined condition. The second-stage flip-flop includes two inverters 177 and 178, a transmission gate 176 for returning the output of the inverter 178 to the inverter 177 under a predetermined condition, and a transmission gate 175 for applying the output of the first-stage flip-flop to the inverter 177 under a predetermined condition. The predetermined conditions are generated according to a signal input to the frequency divider 18 and according to a signal obtained by inverting the input signal in the inverter 170. Further, the second-stage flip-flop feeds an output to the first-stage flip-flop through the inverter 179 and outputs a signal with a frequency which is half the frequency of the input signal.

A description will now be given of the operation.

Elements are selected such that the elements in the first delay circuit 1 have electrical characteristics identical with electrical characteristics of the corresponding elements in a second delay circuit 2.

During an actually active time of the semiconductor device, the switch 15 is kept closed. Further, a clock signal is input to a clock input terminal $X_{in}$. Like the embodiment 1, as an example, a description will be given of a case where a clock signal of 25 MHz is input. The clock signal input to the input terminal $X_{in}$ is fed as a reference clock signal ref to a phase comparator 5 through a buffer 8. The other input terminal of the phase comparator 5 is fed with a clock signal CLK from the frequency divider 18. When a phase of the clock signal CLK lags behind a phase of the reference clock signal ref, the phase comparator 5 sets a U signal in a significant state. When the phase of the clock signal CLK leads the phase of the reference clock signal ref, the phase comparator 5 sets a D signal in a significant state. When the clock signal CLK and the reference clock signal ref are in phase, neither the U signal nor the D signal is set in the significant state.

As in the embodiment 1, when the U signal is significant, a charge pump 6 outputs a high voltage instruct signal $P_{out}$. When the D signal is significant, the charge pump 6 outputs a low voltage instruct signal $P_{out}$. When neither the U signal nor the D signal is significant, as in the embodiment 1, neither the high signal nor the low signal is output from the charge pump 6. As in the embodiment 1, according to the voltage instruct signal $P_{out}$, a low-pass filter 7 increases the control voltage $V_{cnt}$ when the phase of the clock signal CLK lags behind the phase of the reference clock signal ref. When the phase of the clock signal CLK leads the phase of the reference clock signal ref, the charge pump 6 reduces the control voltage $V_{cnt}$. When the clock signal CLK and the reference clock signal ref are in phase, the control voltage $V_{cnt}$ is kept constant.

The first delay circuit 1 is operated as in the embodiment 1 to oscillate at a frequency of 50 MHz. The frequency divider 18 introduces any one of outputs from the first delay circuit 1. In FIG. 12, output R11 is introduced into the frequency divider 18. The frequency divider 18 having the structure as shown in FIG. 13 divides the frequency of the output R11 into half to generate a clock signal CLK with a frequency of 25 MHz, and the frequency divider 18 feeds the clock signal CLK to the phase comparator 5. According to the above process, the control voltage $V_{cnt}$ is stabilized at when the clock signal CLK input into the phase comparator 5 is stabilized at the frequency of 25 MHz. Therefore, establishment of synchronization in the PLL 300 can stabilize the amounts of delay in delay stages of the first delay circuit 1.

In the embodiment 2, at the actually active time, the second delay circuit 2 is fed with the clock of 25 MHz from the input terminal $X_{in}$, and takes as an input the control voltage $V_{cnt}$ from the low-pass filter 7 of the PLL 300. In the second delay circuit 2 having the structure as shown in FIG. 2, the control voltage $V_{cnt}$ is applied to P-channel transistors 20, 22, 26, 30, 34, 38, 42, 46, and 50, and N-channel transistors 21, 25, 29, 33, 37, 41, 45, 49, and 53. The elements in the second delay circuit 2 have electrical characteristics identical with those of the corresponding elements in the first delay circuit 1. Hence, when synchronization is established in the PLL 300, the delay stages in the second delay circuit 2 have the same amounts of delay as those of the delay stages in the first delay circuit 1.

The pulse generator 4A having the structure as shown in FIG. 4 receives outputs R12, R32, and R42 from the second delay circuit 2. The pulse generator 4A is operated as is the second pulse generator 4 in the embodiment 1 to generate two-phase clocks P1T, P2T. That is, as shown in FIG. 10, it is possible to provide the two-phase clocks P1T and P2T with a phase difference $t_{d2}$ according to the amounts of delay caused by the three delay stages in the second delay circuit 2. In this case, the two-phase clocks P1T and P2T are output as two-phase clocks P1 and P2 serving as a system clock.

In testing the semiconductor device, the switch 15 is kept open. Further, a clock signal is input to the clock input terminal $X_{in}$, and a clock signal is concurrently input to a clock input terminal $X_{out}$. For example, the clock input terminal $X_{in}$ takes as an input a clock signal of 25 MHz, and the clock input terminal $X_{out}$ takes as an input another clock signal of 25 MHz. In this case, the synchronization is established in the PLL 300 with the clock signal input to the clock input terminal $X_{out}$ as a reference clock signal ref. The reference clock signal ref has a frequency identical to a frequency of the reference clock signal ref during the actually active time of the semiconductor device. Therefore, the control voltage $V_{cnt}$ at a time when the synchronization is established in the PLL 300 is identical with the control voltage $V_{cnt}$ at the actually active time of the semiconductor device.

As set forth above, the control voltage $V_{cnt}$ at the time when the synchronization is established in the PLL 300 is input to the second delay circuit 2 as well as to the first delay circuit 1. That is, the delay stages in the second delay circuit 2 have the same amounts of delay as during at the actually active time. Hence, no variation is caused in skew of the two-phase clocks P1T and P2T even when the clock signal input to the input terminal $X_{in}$ varies in frequency.

Thus, when a predetermined signal is given for the test, a set signal can normally be propagated in the semiconductor device. For example, at a time of transition from the operation #1 to the operation #2 in FIG. 11D, the clock signal input to the input terminal $X_{in}$ may be reduced in frequency, thereafter feeding the predetermined signal for the test. Even in such a case, the skew between the two-phase clocks P1T and P2T is identical with skew at the actually active time. That is, even when the clock signal input to the input terminal $X_{in}$ varies in frequency, no variation is caused in skew of the two-phase clocks P1T and P2T. Further, the skew is kept constant when the clock signal is restored to its original frequency. Therefore, when the predetermined signal for the test is given, the set signal can normally be propagated in the semiconductor device.

As set forth above, according to the embodiment 2, during the test of the semiconductor device, no variation is caused in skew of the system clock when the predetermined signal for the test is input to the semiconductor device. Therefore, the predetermined signal can correctly be set in the semiconductor device so that an accurate test can be made on the semiconductor device. For example, an accurate test can be made even when the operation of the semiconductor device such as a microprocessor is switched over. Further, it is sufficient to simply provide only one pulse generator according to the embodiment 2. Thus, as compared with the embodiment 1, the circuit configuration can be simplified.

As stated above, according to the first aspect of the present invention, the system clock generating circuit in the semiconductor device is provided with the second delay circuit having the same structure as that of the first delay circuit in the PLL for receiving a control voltage in the PLL, for generating the clock signal with the frequency according to the control voltage, and for delaying and outputting the clock signal, and the pulse generator for generating the two-phase clocks by using the delayed signals generated by the second delay circuit. Consequently, no variation is caused in skew of the system clock even when the clock signal input into the semiconductor device is varied in frequency. As a result, the predetermined signal for the test can correctly be set in the semiconductor device, and an accurate test can be made on the semiconductor device.

According to the second aspect of the present invention, the system clock generating circuit in the semiconductor device is provided with the PLL including the first pulse generator for generating the two-phase clocks by using the delayed signals, the first switching means for switching between the state in which the first clock signal is fed to the PLL, and the state in which the second clock signal is fed to the PLL and the third clock signal is fed to the second delay circuit, and the second switching means for selecting any one of the two-phase clocks generated by the first pulse generator and the two-phase clocks generated by the pulse generator external to the PLL, and for outputting the selected two-phase clocks as the system clock. Consequently, the same control voltage is applied to the first delay circuit and the second delay circuit, and no variation is caused in skew of the system clock even when the clock signal inputted into the semiconductor device is varied in frequency during the test. As a result, there are effects in that the predetermined signal for the test can correctly be set in the semiconductor device, and the accurate test can be made on the semiconductor device.

According to the third aspect of the present invention, in the system clock generating circuit in the semiconductor device, the first switching means includes the switch arranged between the clock input terminal, and the clock output terminal and the reference clock signal input terminal of the PLL, and another switch arranged between the clock input terminal and the second delay circuit. As a result, there is an effect in that the accurate test can be made on the semiconductor device even when the operation is switched over in the semiconductor device such as the microprocessor having the clock input terminal and the clock output terminal.

According to the fourth aspect of the present invention, the system clock generating circuit in the semiconductor device is provided with the switching means for switching between the state in which the first clock signal is fed to the PLL and the second delay circuit and the state in which the second clock signal is fed to the PLL and the third clock signal is fed to the second delay circuit. Consequently, the same control voltage is applied to the first delay circuit and the second delay circuit, and no variation is caused in skew of the system clock even when the clock signal inputted into the semiconductor device is varied in frequency during the test. As a result, there are effects in that the predetermined signal for the test can correctly be set in the semiconductor device, and the accurate test can be made on the semiconductor device. Further, since it is sufficient to simply provide only one pulse generator, there is an effect in that a circuit configuration can be simplified.

According to the fifth aspect of the present invention, in the system clock generating circuit in the semiconductor device, the switching means includes the switch arranged between the clock input terminal, and the clock output terminal and the reference clock signal input terminal of the PLL. As a result, there is an effect in that the accurate test can be made on the semiconductor device even when the operation is switched over in the semiconductor device such as the microprocessor having the clock input terminal and the clock output terminal. Further, since it is sufficient to simply provide only one pulse generator, there is an effect in that a circuit configuration can be simplified.

While preferred embodiments of the invention have been described using specific terms, such description is for illustrative purposes only, and it is to be understood that changes and variations may be made without departing from the spirit or scope of the following claims.

What is claimed is:

1. A system clock generating circuit for generating two-phase clock signals and preventing high periods of the two-phase clock signals from overlapping, the circuit comprising:

a phase lock loop including:
- a first delay circuit for generating a first clock signal with a frequency according to a control voltage depending upon a phase difference between a reference clock signal and a feedback clock signal and for delaying and outputting the first clock signal,
- a first pulse generator coupled to the first delay circuit for generating first and second two-phase clock signals and preventing high periods of the first and second two-phase clock signals from overlapping, in response to the first clock signal delayed by the first delay circuit;

a second delay circuit structurally similar to the first delay circuit and receiving the control voltage, for generating a second clock signal with a frequency according to the control voltage and for delaying and outputting the second clock signal;

a second pulse generator coupled to the second delay circuit for generating third and fourth two-phase clock signals and preventing high periods of the third and fourth two-phase clock signals from overlapping, in response to the second clock signal delayed by the second delay circuit;

first switching means for switching between a first state in which a first input clock signal is fed to the phase lock loop and the second delay circuit is open-circuited and a second state in which a second input clock signal is fed to the phase lock loop and a third input clock signal is fed to the second delay circuit; and second switching means for selecting at least one of:
  (a) the first and second two-phase clock signals generated by the first pulse generator and
  (b) the third and fourth two-phase clock signals generated by the second pulse generator and for outputting the selected two-phase clock signals as system clock signals.

2. The system clock generating circuit according to claim 1 wherein the first switching means includes a first switch arranged between a clock input terminal and a reference clock signal input terminal of the phase lock loop, and 'a second switch arranged between the clock input terminal and the second delay circuit.

3. A system clock generating circuit for generating two-phase clock signals and preventing high periods of the two-phase clock signals from overlapping, the circuit comprising:

phase lock loop including:
- a first delay circuit for generating a first clock signal with a frequency according to a control voltage depending upon a phase difference between a reference clock signal and a feedback clock signal and for delaying and outputting the first clock signal;

a second delay circuit structurally similar to the first delay circuit and receiving the control voltage, for generating a second clock signal with a frequency according to the control voltage and for delaying and outputting the second clock signal;

a pulse generator coupled to the second delay circuit for generating first and second two-phase clock signals and preventing high periods of the first and second two-phase clock signals from overlapping, in response to the second clock signal delayed by the second delay circuit; and switching means for switching between a first state in which a first input clock signal is fed to the phase lock loop and to the second delay circuit and a second state in which a second input clock signal is fed to the phase lock loop and the first input clock signal is fed to the second delay circuit.

4. The system clock generating circuit according to claim 3, wherein the switching means includes a first switch arranged between a clock input terminal and a reference clock signal input terminal of the phase lock loop.

5. The system clock generating circuit of claim 1 wherein the first, second, and third input clock signals have identical frequencies.

6. The system clock generating circuit of claim 1 wherein, during testing, the third input clock signal has a lower frequency than the second input clock signal.

7. The system clock generating circuit of claim 3 wherein the first and second input clock signals have identical frequencies.

8. The system clock generating circuit of claim 3 wherein, during testing, the first input clock signal has a lower frequency than the second input clock signal.

* * * * *